US009035597B2

(12) United States Patent
Sharaf et al.

(10) Patent No.: US 9,035,597 B2
(45) Date of Patent: May 19, 2015

(54) CHARGER ASSEMBLY WITH HEAT TRANSFER DUCT

(75) Inventors: Nadir Sharaf, Bloomfield Township, MI (US); Slobodan Pavlovic, Novi, MI (US); Rutunj Rai, Canton, MI (US); Dilip Daftuar, West Bloomfield, MI (US); Juan Lopez, Royal Oak, MI (US); Reshma Rathod, Auburn Hills, MI (US)

(73) Assignee: Lear Corporation, Southfield, MI (US)

( * ) Notice: Subject to any disclaimer, the term of this patent is extended or adjusted under 35 U.S.C. 154(b) by 631 days.

(21) Appl. No.: 13/307,222

(22) Filed: Nov. 30, 2011

(65) Prior Publication Data

US 2013/0134925 A1    May 30, 2013

(51) Int. Cl.
*H02J 7/00* (2006.01)
*H05K 7/20* (2006.01)

(52) U.S. Cl.
CPC ............ *H05K 7/209* (2013.01); *H02J 7/0042* (2013.01)

(58) Field of Classification Search
USPC ........................................ 320/107
See application file for complete search history.

(56) References Cited

U.S. PATENT DOCUMENTS

| 4,508,640 | A | | 4/1985 | Kanda et al. |
| 5,412,024 | A | | 5/1995 | Okada et al. |
| 5,422,787 | A | * | 6/1995 | Gourdine ...................... 361/697 |
| 5,491,892 | A | | 2/1996 | Fritz et al. |
| 5,519,169 | A | | 5/1996 | Garrett et al. |
| 5,639,989 | A | | 6/1997 | Higgins, III |
| 5,740,015 | A | | 4/1998 | Donegan et al. |
| 5,831,240 | A | * | 11/1998 | Katooka et al. ............ 219/130.1 |
| 6,069,315 | A | | 5/2000 | Tang |
| 6,313,991 | B1 | * | 11/2001 | Nagashima et al. .......... 361/699 |
| 6,426,874 | B2 | * | 7/2002 | Kajiura ......................... 361/700 |
| 6,733,345 | B2 | | 5/2004 | Weise et al. |
| 6,839,240 | B2 | | 1/2005 | Skofljanec et al. |
| 7,013,558 | B2 | | 3/2006 | Bachman |
| 7,050,305 | B2 | * | 5/2006 | Thorum ........................ 361/719 |
| 7,479,020 | B2 | | 1/2009 | Whitton |
| 7,488,901 | B2 | | 2/2009 | Arnold |
| 7,660,099 | B2 | | 2/2010 | Imamura et al. |
| 7,726,440 | B2 | | 6/2010 | Aisenbrey |
| 7,788,801 | B2 | | 9/2010 | Oggioni et al. |
| 7,804,688 | B2 | | 9/2010 | Wakabayashi et al. |
| 7,817,431 | B2 | | 10/2010 | Baker |
| 8,040,005 | B2 | | 10/2011 | Bhatti |

(Continued)

FOREIGN PATENT DOCUMENTS

JP    2005093515 A    4/2005
WO    2010144399 A2    12/2010

OTHER PUBLICATIONS

CurrentWays.com, "BC-Series 3kW 112—450 Volts IP67 Rated Liquid-Cooled EV Battery Charger", currentways Technologies, Oct. 20, 2011, 4 pages.

(Continued)

*Primary Examiner* — Samuel Berhanu
(74) *Attorney, Agent, or Firm* — Brooks Kushman P.C.

(57) ABSTRACT

A charger assembly is provided with a housing having a cavity with an opening. A cover is fastened to the housing for covering the opening. A heat transfer duct is mounted to the cover with an inlet end and an outlet end each extending through the cover. A plurality of heat sinks is mounted to the cover in contact with the heat transfer duct. A plurality of circuit board assemblies are each mounted to the cover in contact with the plurality of heat sinks.

15 Claims, 4 Drawing Sheets

(56) References Cited

U.S. PATENT DOCUMENTS

| | | |
|---|---|---|
| 8,471,145 B2 | 6/2013 | Suzuki |
| 2003/0175454 A1 | 9/2003 | Lichtenstein et al. |
| 2003/0221849 A1 | 12/2003 | Pommerenke et al. |
| 2007/0240867 A1 | 10/2007 | Amano et al. |
| 2007/0246191 A1 | 10/2007 | Behrens et al. |
| 2007/0247817 A1* | 10/2007 | Huang .................... 361/719 |
| 2010/0014243 A1* | 1/2010 | Tsai et al. ............ 361/679.47 |
| 2011/0214629 A1 | 9/2011 | Benoit |
| 2011/0235276 A1 | 9/2011 | Hentschel et al. |
| 2012/0100414 A1 | 4/2012 | Sonta |

OTHER PUBLICATIONS www.delphi.com, "Delphi Universal On-board Battery Charger", Hybrid/Electrical Vehicle Products, Oct. 1, 2011, 1 page.

www.TDIpower.com, "Liquid Cooled Power Solutions for Electric & Hybrid Vehicles", TDI Power, 2008, 6 pages.

U.S. Appl. No. 13/307,942, "Charger Assembly and Electromagnetic Interference Shield Assembly", filed Nov. 30, 2011, 21 pages.

U.S. Appl. No. 13/307,950, "Housing Assembly to Enclose and Ground an Electrical Subassembly", filed Nov. 30, 2011, 26 pages.

* cited by examiner

CHARGER ASSEMBLY WITH HEAT TRANSFER DUCT

TECHNICAL FIELD

Various embodiments relate to a charger assembly with a heat transfer duct, and methods for assembling a charger assembly.

BACKGROUND

In the advent of electric vehicles, hybrid electric vehicles, and any battery-powered vehicle, charger assemblies have been incorporated for charging the battery or batteries. Such charger assemblies often experience high voltages and are often utilized for converting alternating current to direct current. This conversion results in a high heat output and transmission of electromagnetic interference.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
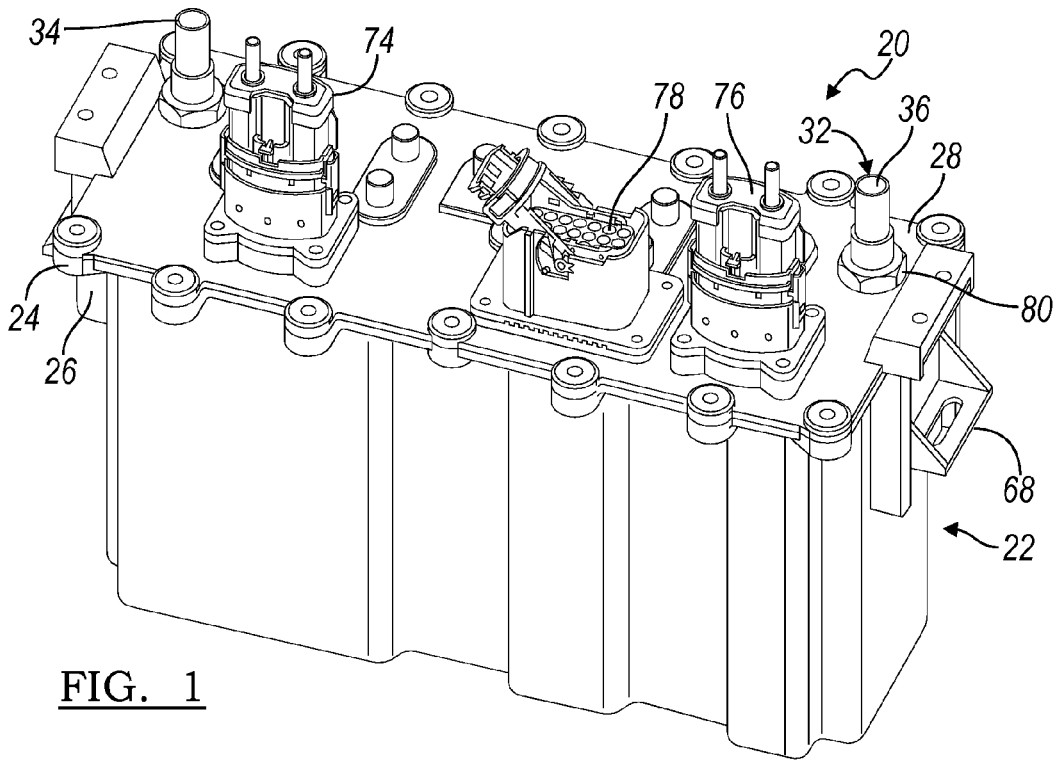
FIG. 1 is a perspective view of a charger assembly according to an embodiment.
Figure 2:
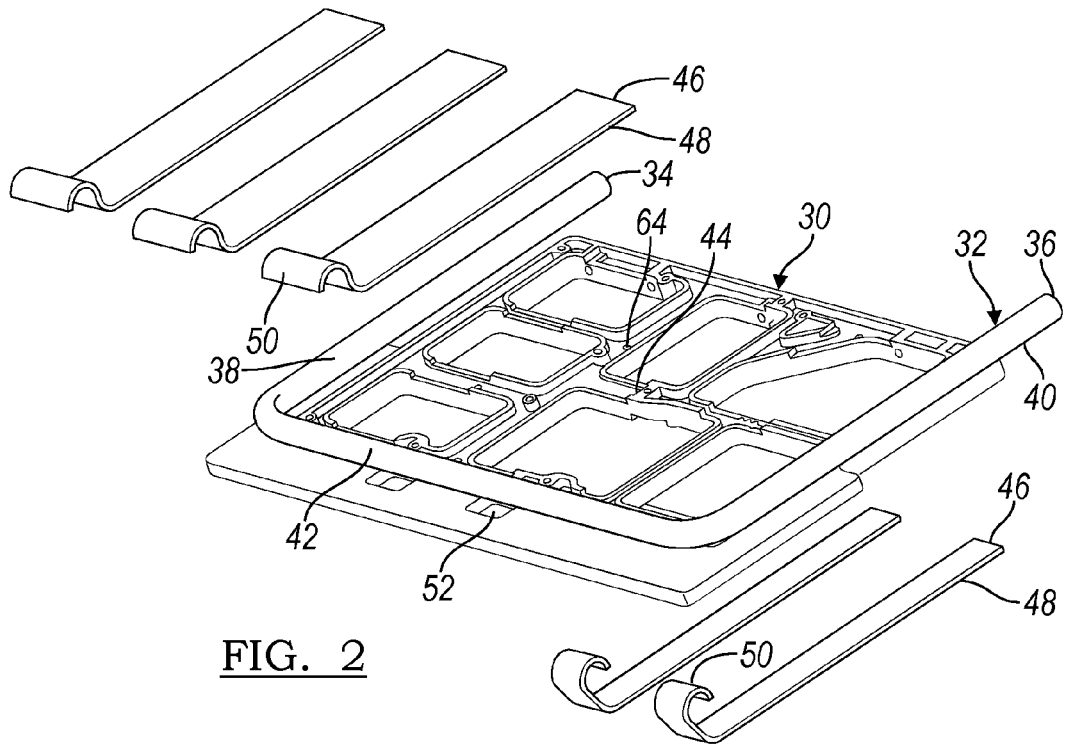
FIG. 2 is an exploded perspective view of heat transfer components of the charger assembly of FIG. 1.

Referring now to FIG. 1, a charger assembly is illustrated and referenced generally by numeral 20. The charger assembly 20, according to an embodiment, is an onboard charger, which is mounted to a vehicle body for charging a battery or batteries of the vehicle. Therefore, the size, shape, weight, rate of heat transfer, electromagnetic interference, durability and cost are all factors for the charger assembly 20 and the associated vehicle.

In the depicted embodiment, the charger assembly 20 has a housing 22. The housing 22 is generally hollow with a cavity therein for receiving components of the assembly 20. The housing 22 may be formed from any suitable material, such as aluminum, or a polymer. For the depicted embodiment, the housing 22 is formed from a conductive polymeric material. The housing 22 has an opening 24 for receiving components of the assembly 20 within the cavity. A mounting surface 26 is provided about the opening 24 for receiving a cover 28 fastened to the mounting surface 26.

Figure 3:
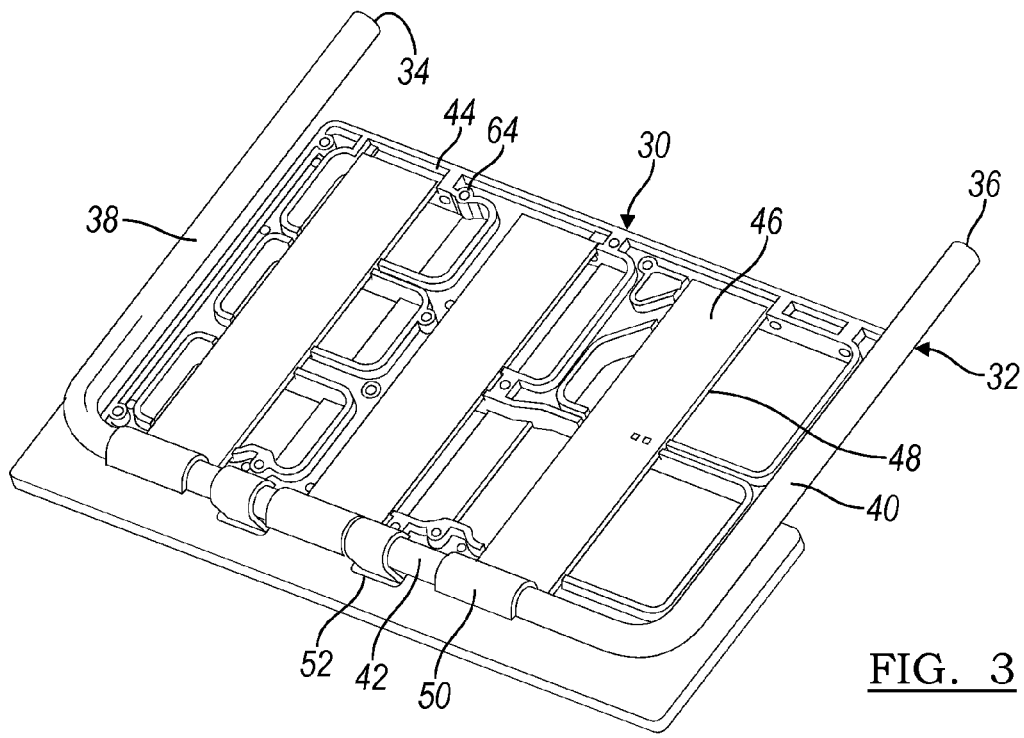
FIG. 3 is a perspective view of the heat transfer components of FIG. 2, illustrated assembled.

Referring now to FIG. 3, the charger assembly 20 includes a substrate 30. The substrate 30 may be formed of any suitable material such as plastic, aluminum, or the like. The substrate 30 is mounted to the cover 28 for being disposed within the cavity of the housing 22.

A heat transfer duct 32 is provided by a continuous bent piece of round tubing 32 for conveying fluid such as water or a coolant through the charger assembly 20. The tubing 32 has a pair of ends 34, 36 that extends through the cover 28 to provide an inlet and an outlet for the heat transfer duct 32. The tubing 32 extends straight in a depth direction from each of the ends 34, 36 for providing a pair of straight regions 38, 40 as inlet and outlet regions 38, 40. An intermediate region 42 extends between the straight regions 38, 40. The tubing 32 is formed from a solid piece to avoid any fittings or connections within the charger assembly 20. The tubing 32 is placed upon the substrate 30. Of course, any pattern of the tubing 32 is contemplated.

The substrate 30 has a plurality of recesses 44 formed therein. The recesses 44 are aligned with high heat zones of associated circuit board assemblies. The recesses 44 are sized to receive a plurality of thermally conductive heat sinks 46. The heat sinks 46 may be formed from a thermally conductive material, such as copper, aluminum, heat pipe, or the like. Each heat sink 46 has a generally planar contact portion 48 for contact with the associated circuit board assembly. Each heat sink 46 also includes an arcuate, or curved, contact portion 50 that is contoured to the shape of the tubing 32 for an area contact with the tubing 32. The heat sinks 46 are not fastened to the substrate 30. The heat sinks 46 are placed within the recesses 44 upon the substrate 30 as illustrated in FIG. 3. Since the tubing 32 is displaced along one side of the substrate 30, the heat sinks 46 on the opposed side extend through apertures 52 so that the curved contact portions 50 engage the tubing 32.

Figure 4:
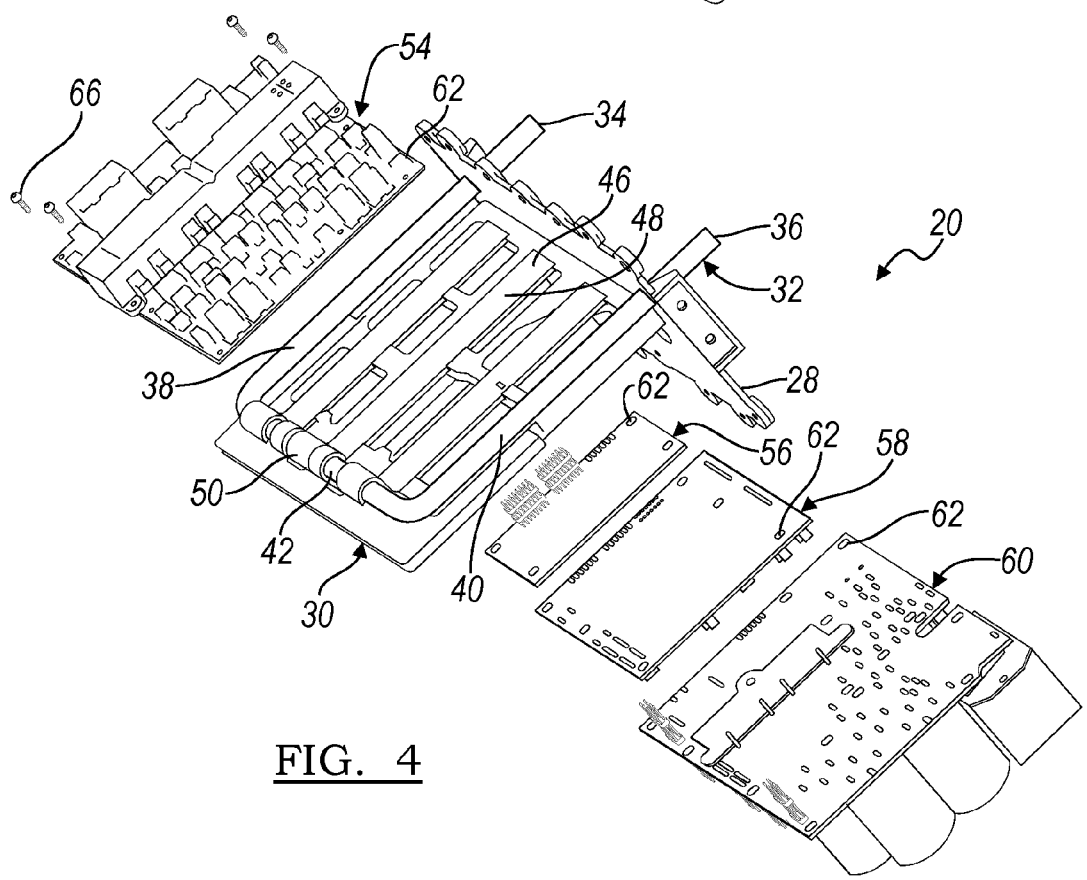
FIG. 4 is an exploded perspective view of the assembled heat transfer components of FIG. 3 and circuit board assemblies.

Referring now to FIG. 4, the cover 28 is assembled to the substrate 30 and the tubing 32. Also, a plurality of circuit board assemblies 54, 56, 58, 60 is assembled to both sides of the substrate 30. The circuit board assemblies 54, 56, 58, 60 each include an aperture pattern 62 that collectively corresponds with an aperture pattern 64 of the substrate 30 for receipt of fasteners 66 for assembling the circuit board assemblies 54, 56, 58, 60 to the substrate 30. By fastening the circuit board assemblies 54, 56, 58, 60 to the substrate 30, the heat sinks 46 are retained between each corresponding circuit board assembly 54, 56, 58, 60 and the substrate 30. The heat sinks 46 are aligned with high heat zones of the associated circuit board assemblies 54, 56, 58, 60 to transfer the heat from the circuit board assemblies 54, 56, 58, 60 to the tubing 32. By conveying a fluid through the tubing 32, the heat is transferred from the heat sinks 46 to the tubing 32, and consequently to the fluid within the tubing 32 for transferring the heat out of the charger assembly 20.

Although various circuit board assemblies 54, 56, 58, 60 are contemplated, the circuit board assemblies 54, 56, 58, 60 may each be provided on a printed circuit board. The circuit board assemblies 54, 56, 58, 60 may include power, control, and power factor correction. Of course, various circuit board assemblies are contemplated.

Figure 5:
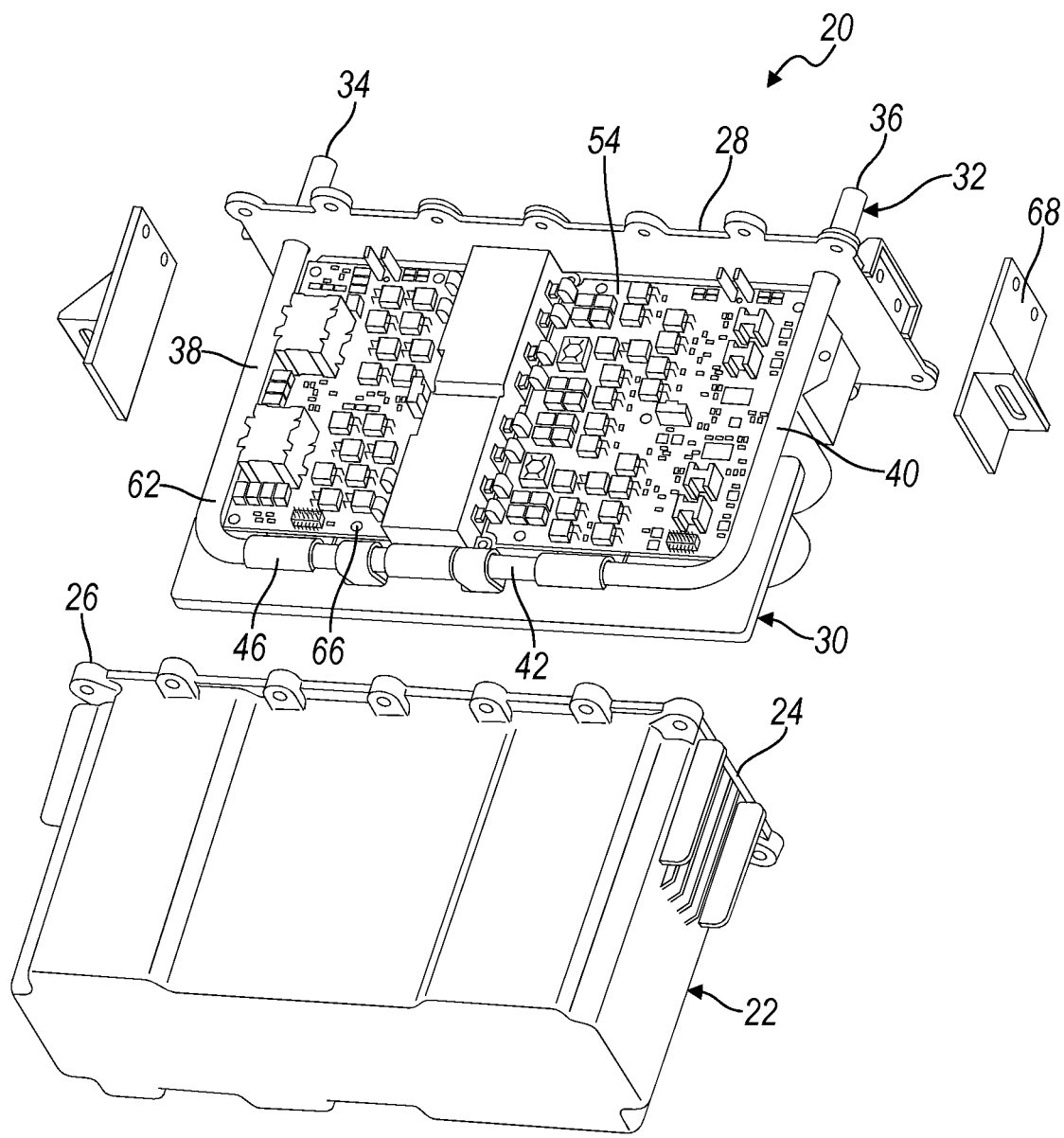
FIG. 5 is an exploded perspective view of the charger assembly of FIG. 1.

With reference now to FIG. 5, all of the components of the charger assembly 20 are assembled prior to being inserted into the housing 22. Thus, assembly of the components can occur at a location that is external of the housing 22. Therefore, accessibility to the various components is enhanced. Likewise, assembly does not occur within the housing 22 itself. In the depicted embodiment, the housing 22 has only one opening. The simplification is an enhancement over prior art charger assemblies that have various access openings and therefore various covers for access, assembly, and enclosing various components of the prior art charger assembly.

Figure 6:
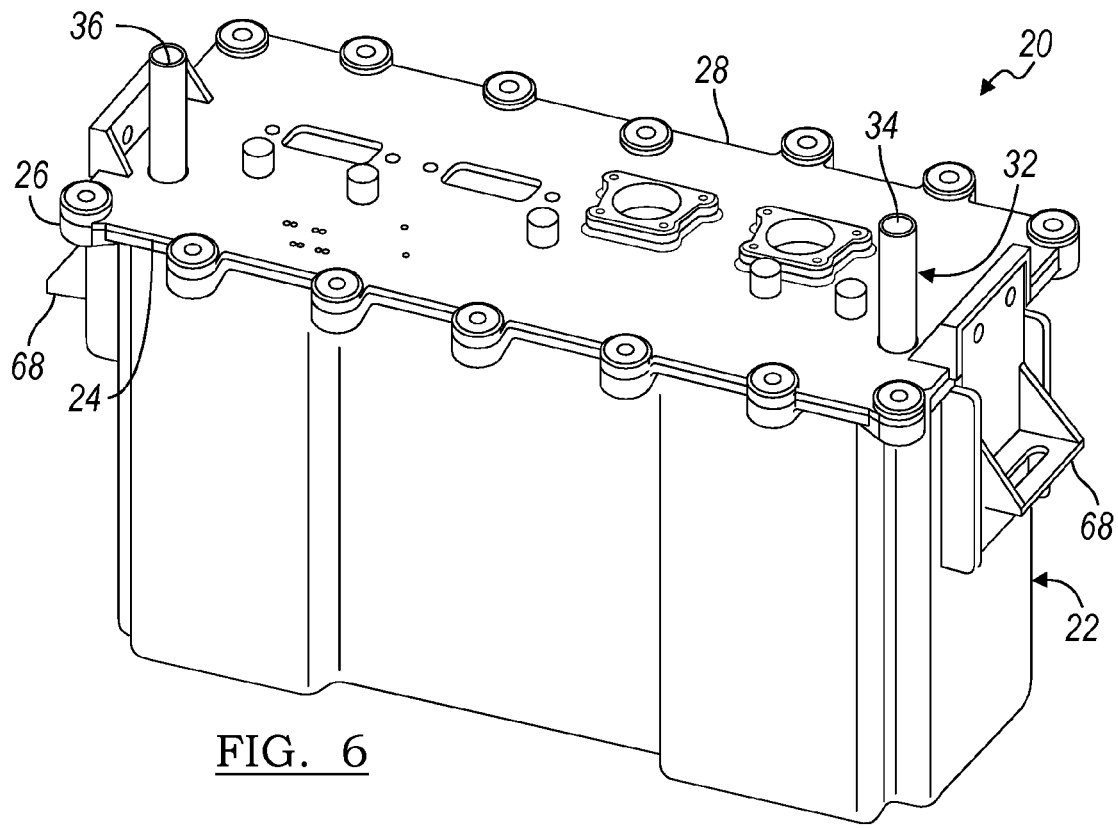
FIG. 6 is a perspective view of the charger assembly of FIG. 1, illustrated partially assembled.
Figure 7:
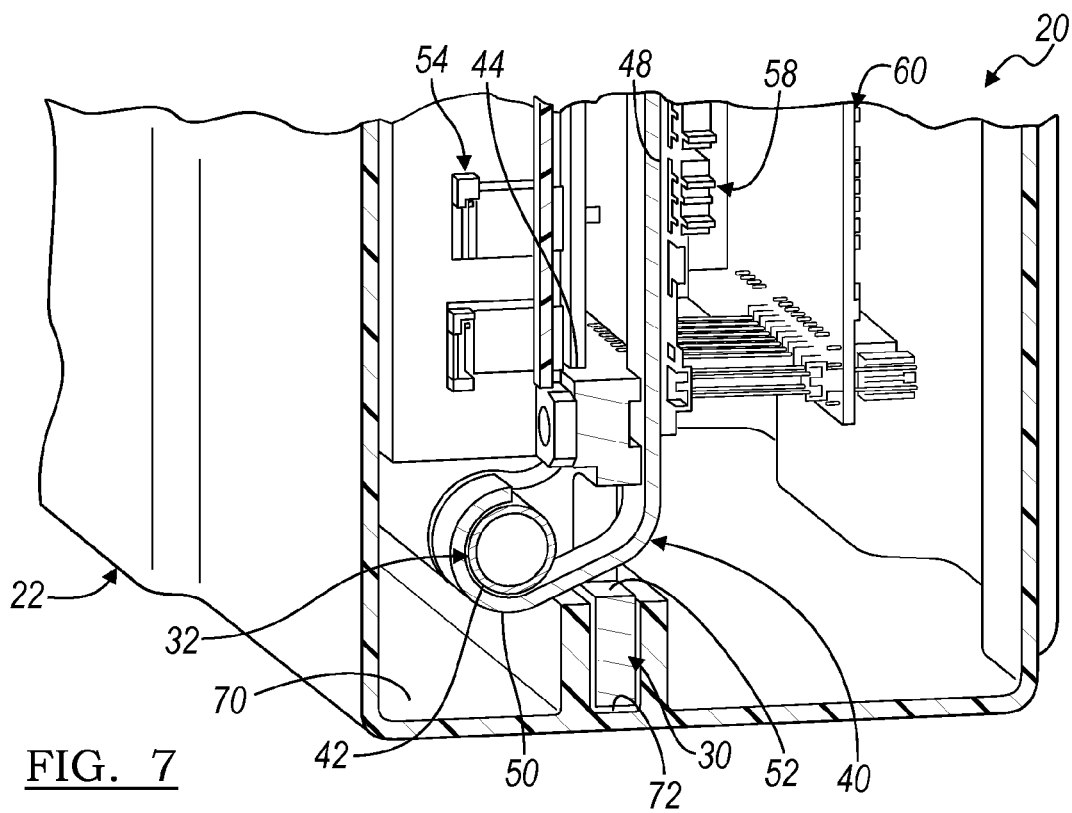
FIG. 7 is a section view of the charger assembly of FIG. 1.

FIG. 5 also illustrates a pair of mounting brackets 68 that are fastened to the cover 28 for supporting and fastening the charger assembly 20 to an underlying support structure, such as the vehicle body. The assembled cover 28, mounting brackets 68 and housing 22 are illustrated in FIG. 6. FIG. 7 illustrates a cross section of the charger assembly 20. The housing 22 includes a cavity 70 for receiving the components assembled to the cover 28. A channel 72 is formed within a bottom surface of the housing 22 for receiving a proximal end of the substrate 30.

Referring again to FIG. 1, a plurality of connectors is assembled to the cover 28 in electrical connection with the circuit board assemblies 54, 56, 58, 60. For example, two power connectors 74, 76 and one signal connectors 78 may be fastened to the cover 28. Additionally, fittings 80 may be provided on the tubing ends 34, 36 external of the housing 22.

As discussed above, the housing 22 may be provided from a conductive plastic material. The conductive plastic material may be utilized for shielding electromagnetic interference (EMI) and/or grounding of the charger assembly 20. Likewise, the relative flexibility of the housing 22 provides a sealed connection with the cover 28 so that an additional seal is not required in order to seal the components of the charger assembly 20 from external contaminants.

The packaging of the housing 22 permits simplified alignment and structure with all connections oriented in a common direction for accessibility, ease in assembly, and minimizing wiring, and permitting utilization of the housing 22 with only one opening 24.

Prior art charger assemblies often utilize a cast aluminum housing with multiple openings requiring multiple covers. Due to the inflexibility of cast aluminum, seals are required, which are less reliable than the connection provided by fastening the cover 28 to the mounting surface 26 of the housing 22. Therefore, leakage is reduced with the plastic housing 22, while weight is also reduced. For example, the depicted charger assembly 20 weighs generally 5 kilograms wherein the prior art charger assembly weighs approximately 7 kilograms. Additionally, a molded conductive plastic housing is cheaper in materials and manufacturing than a cast aluminum housing.

By utilization of the heat sinks 46, the heat can be conducted directly from the heat source to the tubing 32 thereby avoiding complicated tubing paths and geometries. By retaining the heat sinks 46 between the circuit board assemblies 54, 56, 58, 60 and the substrate 30, additional fasteners can be avoided.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A charger assembly comprising:
    a housing having a cavity with an opening;
    a cover fastened to the housing to cover the opening;
    a heat transfer duct mounted to the cover with an inlet end and an outlet end each extending through the cover;
    a plurality of heat sinks mounted to the cover in contact with the heat transfer duct; and
    a plurality of circuit board assemblies each mounted to the cover in contact with the plurality of heat sinks;
    wherein the heat transfer duct comprises a bent piece of round tubing having an inlet region extending through the cover from the inlet end in a depth direction of the housing, an intermediate region extending transversely through the housing, and an outlet region extending in the depth direction through the cover from the intermediate region to the outlet end; and
    wherein each heat sink comprises a generally planar contact portion to contact the circuit board assembly, and a curved portion to extend around the round tubing.

2. The charger assembly of claim 1 further comprising a substrate supported upon the cover and extending into the cavity, wherein the heat transfer duct, the plurality of heat sinks, and the plurality of circuit board assemblies are mounted to the substrate.

3. The charger assembly of claim 2 wherein the substrate has an aperture pattern;
    wherein each circuit board assembly has an aperture pattern; and
    wherein the charger assembly further comprises a plurality of fasteners, each fastener extending through the aperture pattern of one of the circuit board assemblies and the substrate to affix the circuit board assemblies to the substrate.

4. The charger assembly of claim 3 wherein the substrate has a plurality of recesses formed therein each sized to receive one of the heat sinks.

5. The charger assembly of claim 4 wherein the plurality of heat sinks is retained in the plurality of recesses by the circuit board assemblies.

6. A charger assembly comprising:
    a housing having a cavity with an opening adjacent to a mounting surface;
    a cover fastened to the mounting surface to cover the opening;
    a substrate supported upon the cover and extending into the cavity;
    a heat transfer duct mounted to the substrate with an inlet end and an outlet end each extending through the cover;
    a plurality of circuit board assemblies each mounted to the substrate in conductive connection with the heat transfer duct;
    wherein the cover is fastened to the mounting surface without an additional seal;
    a plurality of heat sinks mounted to the cover in contact with the heat transfer duct and in contact with the plurality of circuit board assemblies;
    wherein the heat transfer duct comprises a bent piece of round tubing having an inlet region extending through the cover from the inlet end in a depth direction of the housing, an intermediate region extending transversely through the housing, and an outlet region extending in the depth direction through the cover from the intermediate region to the outlet end; and
    wherein each heat sink comprises a generally planar contact portion to contact the circuit board assembly, and a curved portion to extend around the round tubing.

7. The charger assembly of claim 6 further comprising a plurality of connectors mounted to the cover in electrical connection with the plurality of circuit board assemblies.

8. The charger assembly of claim 7 wherein the plurality of connectors comprises two power connectors and one signal connector.

9. The charger assembly of claim 6 wherein the housing has only one opening.

10. The charger assembly of claim 6 wherein the housing has a channel formed therein to receive a proximal end of the substrate.

11. The charger assembly of claim 6 wherein the housing is formed from a conductive plastic material.

12. A method for assembling a charger assembly comprising:—
   Installing a heat transfer duct to a cover with an inlet end and an outlet end each extending through the cover, wherein the heat transfer duct comprises a bent piece of round tubing having an inlet region extending through the cover from the inlet end in a depth direction of a housing, an intermediate region extending transversely through the housing, and an outlet region extending in the depth direction through the cover from the intermediate region to the outlet end;
   Installing a plurality of circuit board assemblies to the cover in conductive connection with the heat transfer duct;
   Installing the cover to the housing such that the circuit board assemblies are oriented within a cavity in the housing and enclosed by the cover;
   Installing the heat transfer duct to a substrate prior to installing the heat transfer duct to the cover;
   assembling a plurality of heat sinks to the substrate each in contact with the heat transfer duct prior to installing the cover to the housing, wherein each heat sink comprises a generally planar contact portion to contact the plurality of circuit board assemblies, and a curved portion to extend around the round tubing; and
   assembling the plurality of heat sinks to the substrate without fastening the heat sinks to the substrate.

13. The method of claim 12 further comprising inserting the inlet and outlet ends of the heat transfer duct through the cover prior to installing the cover to the housing; and
   installing the cover upon the substrate prior to installing the cover to the housing.

14. The method of claim 13 further comprising installing the plurality of circuit board assemblies to the substrate, each in contact with one of the plurality of heat sinks prior to installing the cover to the housing.

15. The charger assembly of claim 1 wherein the tubing has a uniform wall thickness.

\* \* \* \* \*